United States Patent
Chow et al.

(10) Patent No.: US 11,700,712 B2
(45) Date of Patent: Jul. 11, 2023

(54) FLOATING HEAT SINK FOR USE WITH A THERMAL INTERFACE MATERIAL

(71) Applicant: HEWLETT PACKARD ENTERPRISE DEVELOPMENT LP, Houston, TX (US)

(72) Inventors: Tatt Hoong Chow, Houston, TX (US); Tri Luong Nguyen, Houston, TX (US); Mun Hoong Tai, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 21 days.

(21) Appl. No.: 17/463,106

(22) Filed: Aug. 31, 2021

(65) Prior Publication Data
US 2023/0066079 A1    Mar. 2, 2023

(51) Int. Cl.
*H05K 7/20*    (2006.01)
*G02B 6/42*    (2006.01)

(52) U.S. Cl.
CPC ......... *H05K 7/2049* (2013.01); *G02B 6/4269* (2013.01); *H05K 7/20418* (2013.01)

(58) Field of Classification Search
CPC . G02B 6/4269; H05K 7/20418; H05K 7/2049
See application file for complete search history.

(56) References Cited

U.S. PATENT DOCUMENTS

| | | | | |
|---|---|---|---|---|
| 7,539,020 B2* | 5/2009 | Chow | ............... | H05K 7/20781 361/759 |
| 7,974,098 B2* | 7/2011 | Oki | ...................... | G02B 6/4201 165/185 |
| 8,289,710 B2* | 10/2012 | Spearing | ............ | H05K 7/20781 361/699 |
| 8,911,244 B2* | 12/2014 | Elison | ............... | H05K 7/20409 439/137 |
| 10,874,032 B2* | 12/2020 | Leigh | .................. | H05K 7/20636 |
| 11,300,363 B2* | 4/2022 | Gupta | ........................ | F28F 3/02 |
| 11,462,852 B2* | 10/2022 | Chiu | ......................... | G02B 6/42 |
| 2023/0034486 A1* | 2/2023 | Scott | ..................... | H05K 7/1402 |

FOREIGN PATENT DOCUMENTS

WO    WO-2022199439 A1 *   9/2022   ............... H05K 7/20

* cited by examiner

*Primary Examiner* — Robert J Hoffberg
(74) *Attorney, Agent, or Firm* — Nolte Lackenbach Siegel

(57) ABSTRACT

A technique and corresponding device to provide for a floating heat sink is disclosed. The technique includes a method that allows for insertion of an electronic component (e.g., an optical transceiver) into a cage that has a pre-installed heatsink. At the beginning phases of insertion, no friction is present between the electronic component and the heatsink. At or very near an insertion end phase (the electronic component is almost fully inserted), an actuator (e.g., roller or button) is impacted to impart a pivot motion via a lever arm to cause lowering of the heatsink toward the electronic component. A thermal interface material (TIM) may therefore be present to establish a thermal coupling between the heatsink and the electronic component. The TIM and heatsink contact the electronic component via a downward motion (caused by the pivot) to provide a nearly frictionless sliding impact to the TIM.

17 Claims, 7 Drawing Sheets

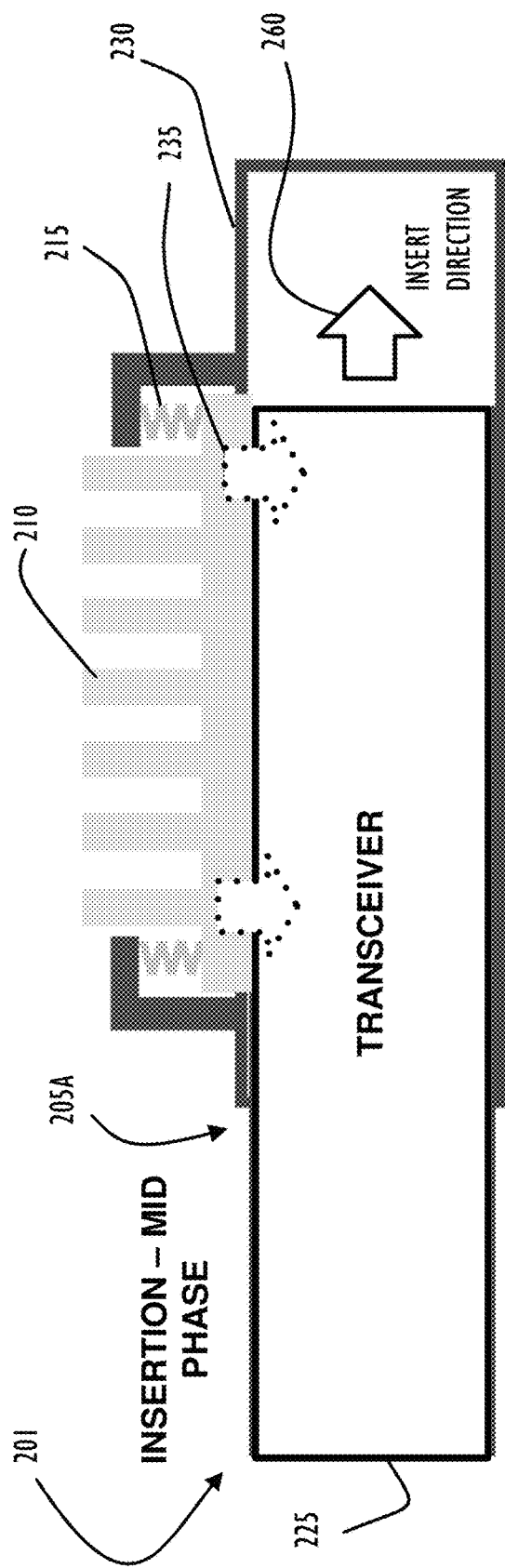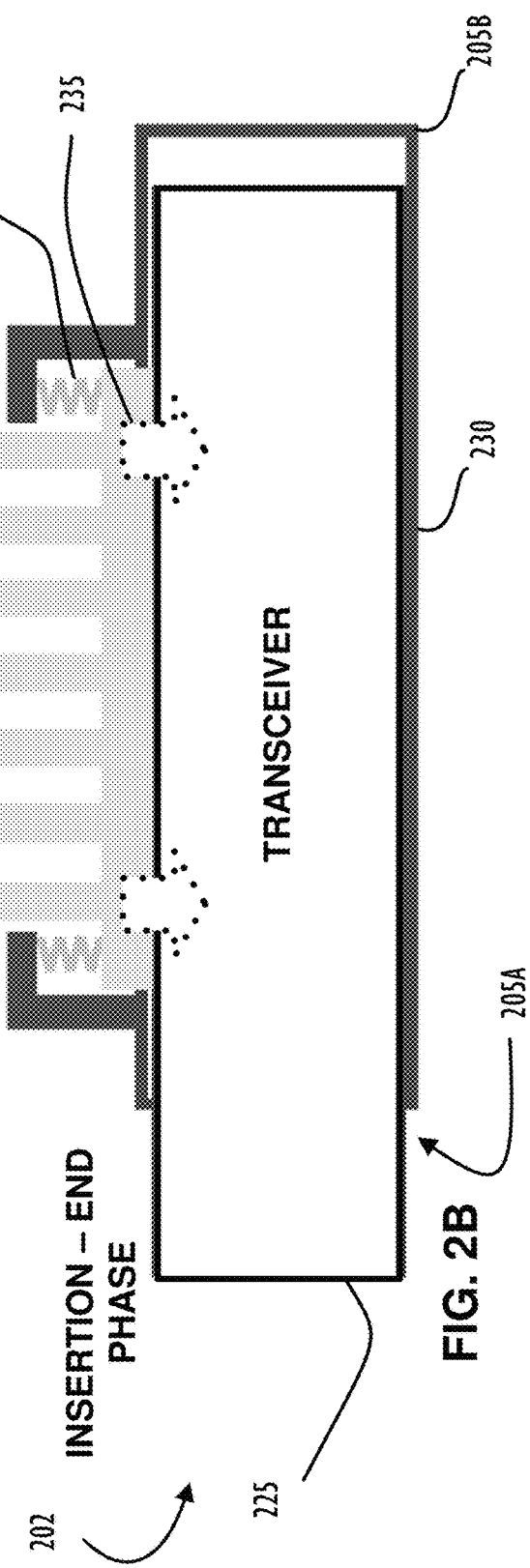

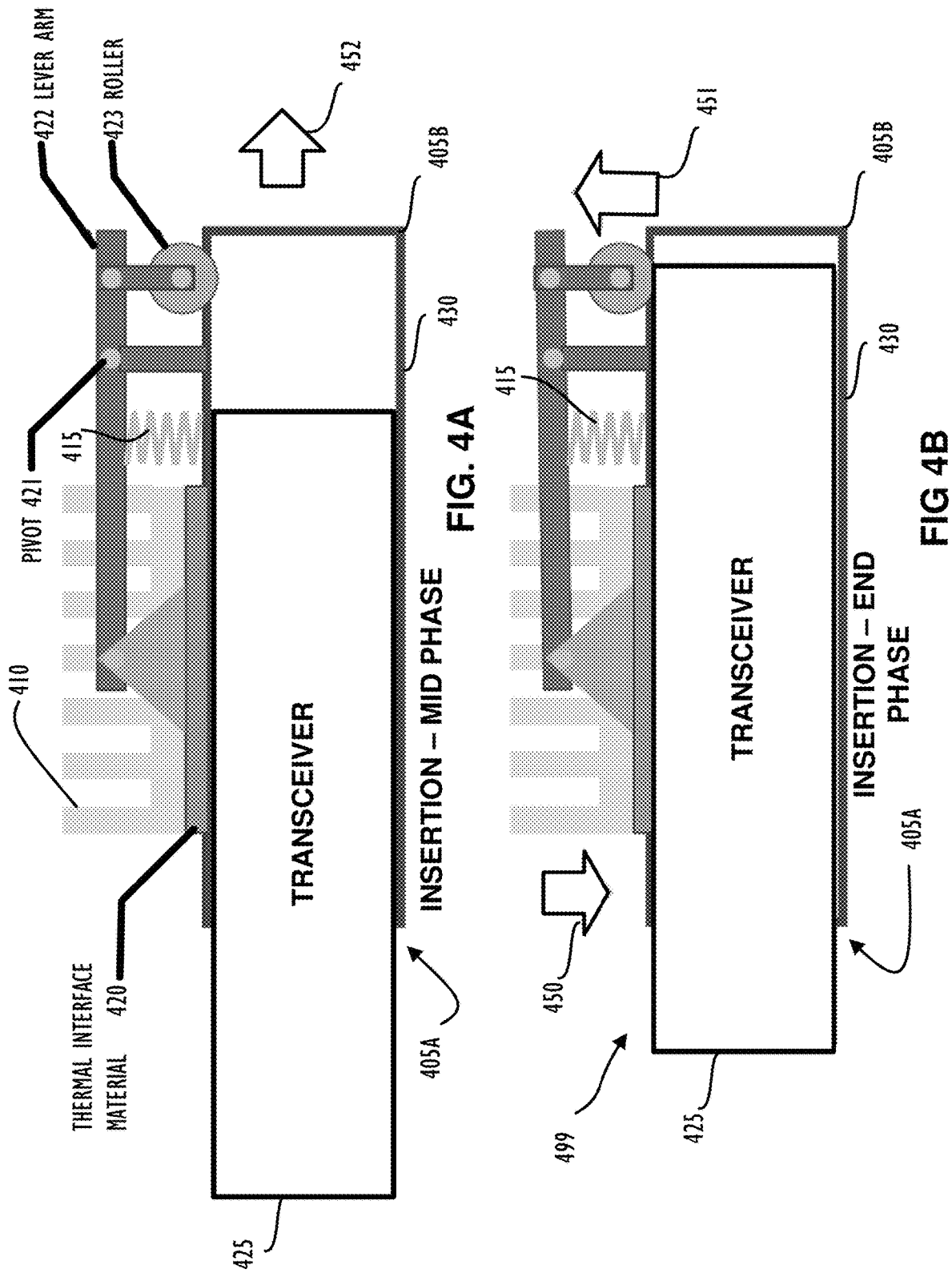

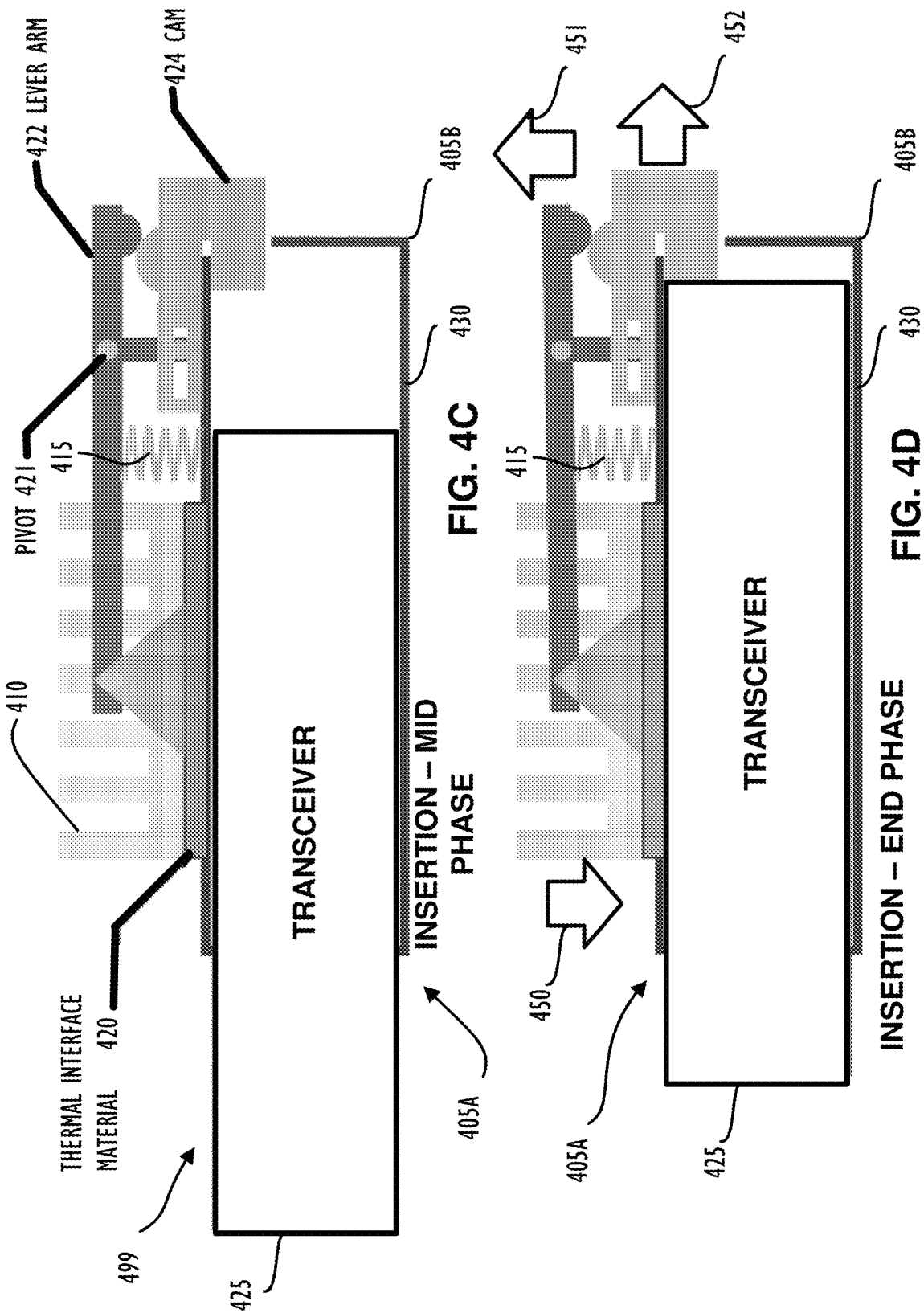

FLOATING HEAT SINK FOR USE WITH A THERMAL INTERFACE MATERIAL

BACKGROUND

Compute systems frequently use "electronic components" and "heatsinks". In operation, electronic components produce heat. One or more heatsinks can be thermally coupled to one or more electronic components to assist in dissipating (i.e., removing) heat in an attempt to maintain the temperature of the associated electronic component within its normal operating temperature range.

BRIEF DESCRIPTION OF THE DRAWINGS

The invention may be understood by reference to the following description taken in conjunction with the accompanying drawings, in which like reference numerals identify like elements, and in which:

FIG. 2A is a block diagram schematically illustrating an insertion mid phase (partial insertion) for a transceiver into a riding heatsink implementation.

FIG. 2B is a block diagram continuing the example of FIG. 2A at an insertion end phase (nearly full insertion) for the transceiver into the riding heatsink implementation in accordance with conventional practice.

FIG. 4A is a block diagram illustrating an insertion mid phase (partial insertion) for a transceiver into a floating heatsink implementation in accordance with this disclosure.

FIG. 4B is a block diagram continuing the example of FIG. 4A at an insertion end phase (nearly full insertion) for the transceiver into the floating heatsink implementation in accordance with this disclosure.

FIG. 4C is a block diagram illustrating an insertion mid phase (partial insertion) for a transceiver into an alternative floating heatsink implementation (e.g., cam actuator rather than roller actuator) in accordance with this disclosure.

FIG. 4D is a block diagram continuing the example of FIG. 4C at an insertion end phase (nearly full insertion) for the transceiver into the alternative floating heatsink implementation in accordance with this disclosure.

Figure 1:
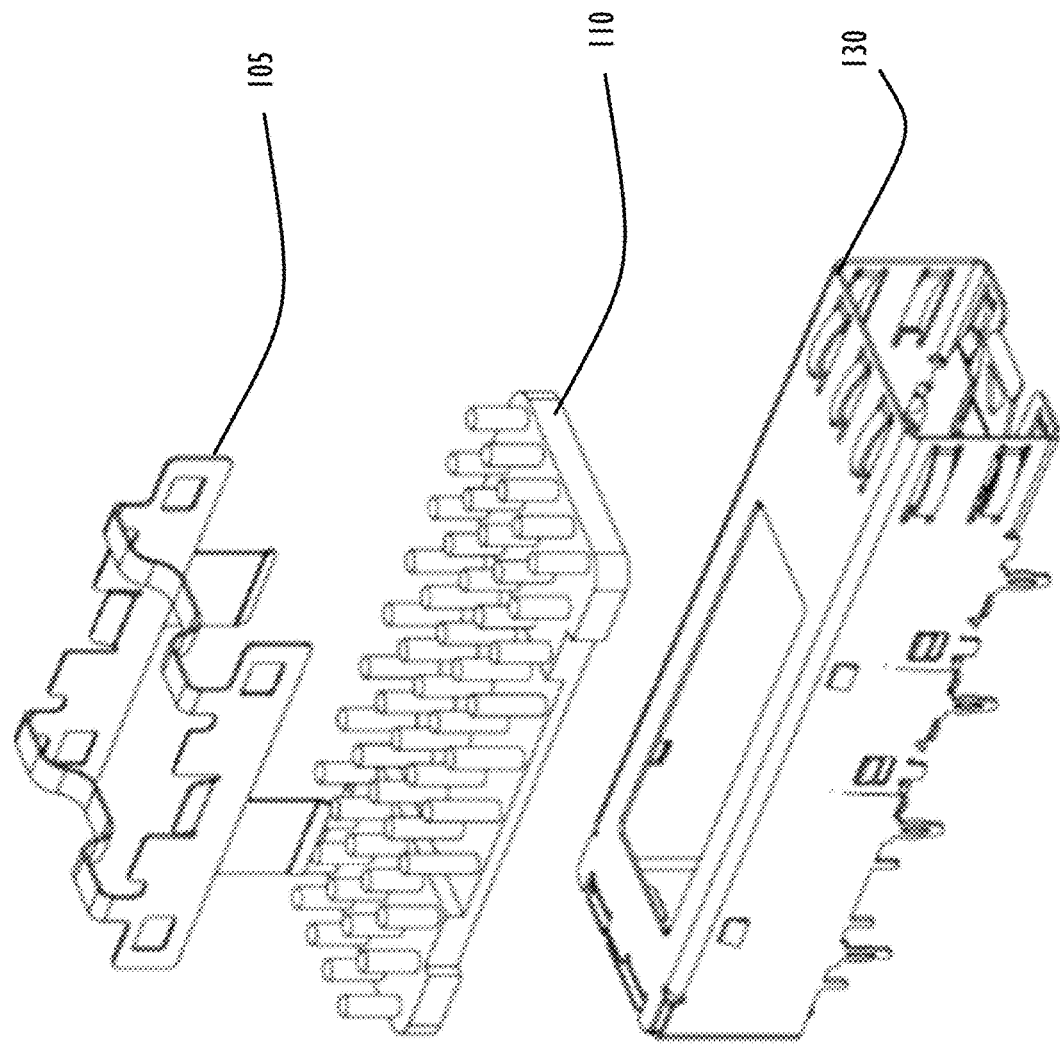
FIG. 1 is an exploded view of a riding heatsink implementation in accordance with one possible riding heatsink implementation.

While the invention is susceptible to various modifications and alternative forms, the drawings illustrate specific embodiments herein described in detail by way of example. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

A thermal interface material ("TIM") is sometimes placed between an electronic component heat surface and a bottom portion of a heatsink. The bottom portion is typically a bottom flat surface and the top portion of a heatsink may have fins or other protrusions that allow for an increased surface area. The increased surface area may be exposed to air or liquid coolant to assist in heat dissipation.

The TIM is not always present and is used to improve thermal conductivity between two surfaces (i.e., flat bottom of a heatsink and heat dissipating surface of electronic component associated with that heatsink). When present, the TIM is usually a relatively thin, thermally conductive, and compliant (easily deformable) material placed between two devices at their thermal interface to improve heat transfer rates by filling air gaps that would otherwise occur between the devices due to surface roughness and/or misalignment. Common examples include thermal gap pads, thermal grease, thermal paste.

In a "riding heatsink", the heatsink may be integrated into a cage (e.g., device enclosure) and obtain thermal conductivity with an electronic component upon insertion of that electronic component into the cage. The riding heatsink may include one or more springs to provide downward pressure to force the heatsink into physical contact with an inserted electronic component. Thus, the heatsink, of a riding heatsink implementation, slides along the upper surface of the electronic component as that electronic component is inserted into the cage. This sliding includes friction between the heatsink and the upper surface of the electronic component. As a result of this friction, any TIM, if present, would be deformed during the insertion. Accordingly, in a riding heatsink implementation a TIM is typically not used. When fully inserted, the springs continue to provide downward force to maintain physical contact.

Illustrative embodiments of the subject matter claimed below will now be disclosed. In the interest of clarity, not all features of an actual implementation are described in this specification. It will be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

In the examples of this disclosure, the use of the "directional" terms, such as, upward, downward, top, bottom, and other orientational directions are for ease of explanation and may apply only to the specific example in which they are used. Both a riding heatsink and the disclosed "floating heatsink" may be installed on any perimeter side of a cage that is part of a larger computer chassis (e.g., rack or server enclosure). As will be explained in more detail below, the movement of a heatsink to contact an electronic component installed within a respective cage may be relative to the design of that cage and may move in multiple acceptable directions to facilitate the concepts of this disclosure.

It is common to install electronic components into computing devices as part of configuring or assembling that computing device. Electronic components may include optical transceivers or other add-on type devices (e.g., memory modules, additional processing resources, etc.) that, once installed and connected to the computing device augment the functionality of the computing device. Electronic components generally produce heat and thus increase the heat dissipation requirements of the computing device. Accordingly, providing individualized heat sinks for each inserted electronic component may be desirable.

The installing of an electronic component may include inserting the electronic component into a mechanism designed to receive that insertion. One such mechanism is a cage assembly. The cage assembly is typically a structure that substantially surrounds the electronic component once it is fully inserted into an internal cavity formed by two sides, a top, and a bottom of the cage. Some cages will include a back and may have an opening on the front that is optionally covered by a door which has an opening mechanism. The door may also be referred to as a faceplate.

As will be explained in more detail below, the insertion process may provide an interaction between the electronic component and the cage. This interaction may be physical and impart mechanical actions. For example, upon insertion, an electronic component may be "locked" into place because a pin of the cage connects to an opening of the electronic module. The interaction may also include connection of power, data busses, or the like between connections of the cage and its associated computing device. These connections may include blind-mate connections.

The insertion process may also include different phases that are not necessarily given distinct names, but for the purposes of this disclosure will be identified as a) an initial phase; b) an insertion mid phase; and c) and insertion end phase. The initial phase may be considered to include the beginning of an insertion process. The initial phase includes aligning the electronic component for insertion, opening a cover door on the cage (if present), and inserting a leading edge (typically the back of the electronic component) into the opening at the front of the cage such that the electronic component will enter an internal cavity of the cage. The initial phase ends when the insertion mid phase begins.

The insertion mid phase may be considered to include the bulk of the insertion process. The insertion mid phase includes the electronic component traversing an area from the opening toward the back of the cage. The insertion mid phase may or may not include interaction between elements of the cage and the electronic component as the electronic component is slid further and further into the internal cavity. The insertion mid phase ends when the insertion end phase begins.

Finally, the insertion end phase may be considered to include a portion of the insertion process that is near a full insertion of the electronic component. During the insertion end phase, interaction between the cage and the electronic component is typical and likely expected. It is during this phase when any locks of the cage to secure the electronic component are typically engaged. It is during the insertion end phase when electrical or optical communicative and/or power connections are formed. It is also during this phase when the floating heatsink described herein performs a thermal connection between the heatsink portion of the floating heatsink mechanism and the electronic component. It is common for the pressure applied for insertion to increase between the insertion mid phase and the insertion end phase, in part, because the back of the cage (e.g., back wall of cage facing the internal cavity) provides different types of mechanical interactions between the electronic component and other cage components.

As briefly mentioned above, the thermal coupling between a heatsink and a corresponding heat producing element (e.g., the above mentioned electronic component) may be formed by contact between the heatsink and a surface of the electronic component. Typically, a heatsink has one flat surface to connect to an electronic component and another surface that includes fins (or other protrusions) that allow air or fluid to circulate between them. The efficiency of the thermal coupling between the heatsink and its associated electronic component is directly related to how well a contact is provided that forms the connection for the thermal coupling. If there are gaps in contact such that air is allowed to remain between the contacting surfaces of the heatsink and the electronic component, the thermal coupling is less efficient than if no air gaps exist. That is, a solid and uniform contact over 100% of the intended surface area is better than partial contact.

A TIM is a type of material that is usually flexible in nature and may be a pad, foam, gel, paste, or the like. The TIM is designed to exist (normally in a relatively thin layer) between a heatsink and its corresponding electronic component. The TIM may eliminate (or at least substantially reduce) the air gaps that might otherwise exist when a rigid surface of a heatsink contacts a surface (likely also rigid) of the electronic component. The TIM is intended to increase the efficiency of the thermal coupling that is used to dissipate heat from the electronic component. In general, a TIM may work best when the connection between the heatsink and its electronic component is formed by a pressing down motion so as to maintain an even distribution of the pad, foam, gel, or paste that is used for the TIM.

One example of an electronic component is an optical transceiver. Optical transceivers, like other electronic components, produce heat. Optical transceivers may be installed into internal cavities of cages and those cages may have integrated heatsinks to provide heat dissipation for the optical transceiver installed therein. The heatsink may have springs to provide downward pressure on the heatsink such that, when installed, the top surface of the transceiver (or the surface associated with the heatsink) rubs against and maintains a pressure (friction) to form the intended thermal coupling between the heatsink of the cage and the transceiver being inserted therein. Accordingly, it may not be possible to utilize a TIM in such a design, at least because, the sliding motion and friction of insertion would disturb and make non-uniform (or effectively scrape off) the TIM that was intended to form a thin layer between the transceiver and the associated heatsink.

This disclosure describes a frictionless or nearly frictionless insertion technique (e.g., a "floating heatsink implementation") and apparatus to address the problems identified above (and others). By providing a frictionless insertion technique, a TIM may be confidently used. The TIM will remain undisturbed by the frictionless insertion process and therefore provide a thermal connection between heatsinks (integrated into cages) and electronic components later inserted into a cage.

Even if a TIM were to be used within a "riding heatsink" implementation (e.g., an implementation with constant pressure applied by downward pressing springs), the insertion friction would disturb and likely reduce the efficiency of the corresponding thermal coupling.

As mentioned above, one aspect of this disclosure relates to a technique and a corresponding device that provide for a floating heatsink as an improved design over a riding heatsink. The technique includes a method that allows for insertion of an electronic component (e.g., an optical transceiver) into a cage that has a pre-installed heatsink. With the floating heatsink technique of the examples disclosed herein, at the beginning phases of insertion, no friction is present between the electronic component and the heatsink. An insertion tolerance for a TIM may be reflected by a distance of clearance during insertion (between the heatsink and an electronic component during mid-insertion phase). There may be a pre-determined tolerance to allow for a TIM to be present on the electronic component and/or on the bottom plate of the heatsink. The tolerance should be slightly larger than the thickness of the TIM if a completely frictionless insertion is desired.

In a floating heatsink implementation, at or very near the end of insertion (when the electronic component is almost fully inserted into the cage and the insertion end phase initiates), an actuator (e.g., roller or button) is impacted to impart a pivot motion via a lever arm to cause lowering of the heatsink (and possibly an attached TIM) toward the electronic component. The TIM may therefore be present to establish a thermal coupling between the heatsink and the electronic component. The TIM and heatsink contact the electronic component via a downward motion (caused by the pivot) to provide a nearly frictionless sliding impact to the TIM.

In contrast, a riding heatsink would maintain a downward pressure (via springs) on the heatsink and rub (i.e., have friction) between the electronic component and the bottom plate of the heatsink throughout the insertion process. Accordingly, a TIM may not be usable in this type of implementation, in part, because the TIM would be rubbed off or made non-uniform because of the sliding friction motion that is inherent with insertion of a device utilizing a riding heatsink.

The examples of this disclosure utilize a generic heatsink. There are many different sizes and shapes of heatsinks. The particulars of the heatsink are not pertinent to many aspects of this disclosure and the disclosed techniques to utilize a heatsink should be considered to work with substantially any type of heatsink. Additionally, this disclosure is explained in the context of transceivers, a fin heatsink style, and their associated cages. However, this is merely for succinctness and illustration. Techniques described herein may be utilized for any type of electronic component and associated heatsinks of different styles.

With an understanding of the above high-level description of a riding heatsink and the improvements provided by a floating heatsink, the discussion now turns to specific implementations by way of examples and reference to the drawings. The examples used are not to be considered limiting as the concepts for the floating heatsink may be implemented using variations of the techniques disclosed herein. For example, the actuator implementation is shown in two examples with a "roller" as an actuator in the example of FIGS. 4A-B and with a "cam" actuator mechanism in the example of FIGS. 4C-D.

Other implementations are also possible without departing from the scope of this disclosure. In general, any technique to cause mechanical movement of the heatsink to create the thermal coupling via a TIM at or very near complete insertion of a transceiver into a cage should be within the scope of this disclosure. Prior art techniques for riding heatsinks cause disruption via friction to any TIM that may be present. Accordingly, it is typical that a TIM is not used with a riding heatsink implementation and the improvements to thermal conductivity provided via the TIM are therefore not available for riding heatsink implementation.

FIG. 1 illustrates an exploded view of apparatus 100 that utilizes some of the components that may be used for a conventional riding heatsink implementation. FIG. 1 includes a retention bracket 105 that may be used to hold heatsink 110 in a desired position relative to cage 130. As illustrated, cage 130 has an opening on the top to accept heatsink 110 and an opening on its front to receive insertion of an electronic component (not yet shown).

FIG. 2A is a block diagram illustrating an insertion mid phase 201 (partial insertion) for a transceiver 225 into a riding heatsink implementation for contrasting to the frictionless insertion provided by the floating heatsink implementation discussed herein. FIG. 2B is a block diagram continuing the example of FIG. 2A at an insertion end phase 202 (nearly full insertion) for the transceiver 225 into the riding heatsink implementation.

As illustrated in FIG. 2A, transceiver 225 is inserted in insertion direction 260 and is pushed into opening 205A toward back 205B of cage 230. As used herein a cage 230 may be a subset of a larger chassis (not shown) in that a chassis may contain multiple cages where each cage 230 is configured to accept a single electronic component such as transceiver 225. The term "chassis cage" refers to a cage of a given chassis. As illustrated, downward pressure is provided to heatsink 210 by one or more springs 215 (there are two in this example).

The downward pressure is illustrated further illustrated by dotted arrows 235. As should be apparent to those of skill in the art, the bottom flat surface of heatsink 210 is to form a thermal coupling with transceiver 225 and the downward pressure of springs 215 assist in making that connection. However, a side effect of the downward pressure provided by springs 215 is that the top of transceiver 225 rubs along the bottom of heatsink 210 throughout the insertion process and creates friction (see dotted arrows 235) on what will become the thermally conductive surface of the electronic component. Accordingly, use of a TIM may not be possible or effective for a riding heatsink implementation. Arrows 235 are illustrated as "dotted" arrows because the downward force provided throughout the insertion mid-phase of a riding heatsink will be removed using the floating heatsink technique.

Note that FIGS. 1 and 2A-B illustrate examples of a riding heatsink which is not the focus of this disclosure. This explanation is provided to contrast the disclosed floating heatsink implementation with the riding heatsink implementation and is provided for comparison purposes. These examples are not intended to represent any specific prior art implementation of a riding heatsink. Accordingly, the illustrated components and their relative positioning within the FIGs. are not necessarily indicative of prior art and are not to be construed to represent admitted prior art.

Turning to the remaining FIGs. of this disclosure, FIGS. 3A-5 are directed to multiple example implementations of a floating heatsink. The operation of the floating heatsink will be described and contrasted to the previously described riding heatsink which is indicative of known implementations.

Figure 3A:
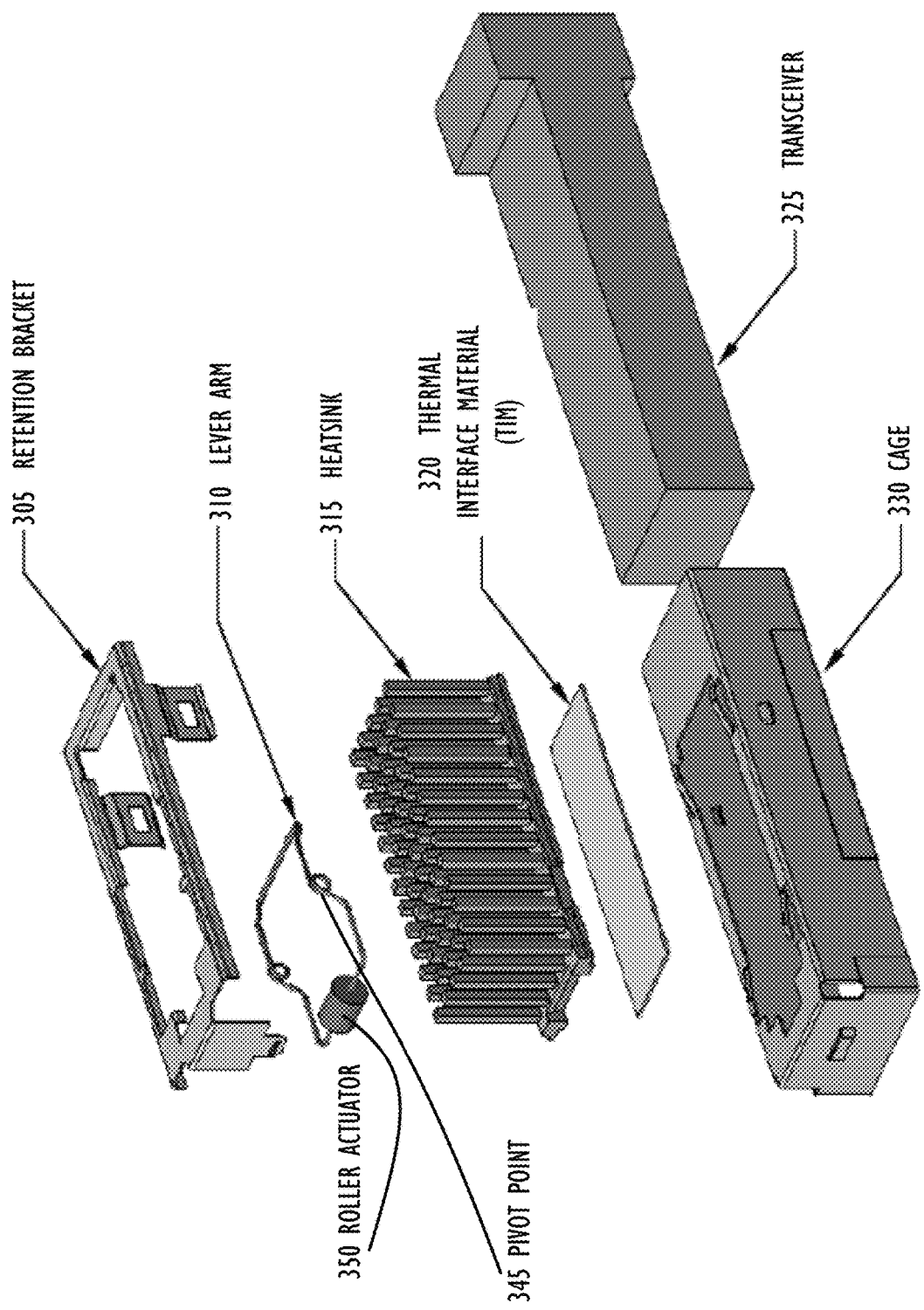
FIG. 3A is an exploded view of components for a "floating heatsink" in accordance with one or more examples of this disclosure.

FIG. 3A is an exploded view of components for a "floating heatsink" in accordance with one or more examples of this disclosure. There may be overlap between components utilized to implement a riding heatsink and a floating heatsink. However, it is important to note that the manner in which the common components may be implemented may be functionally distinct. For example, both types of implementations may include "a spring" but the use of the spring is substantially different in overall function. Also, the heatsink 315 may be identical for either implementation. Additionally, some components (e.g., retention bracket 305) may have modifications relative to their riding heatsink counterparts. Finally, the floating heatsink implementation disclosed herein does not imply that transceiver 325 is different in any way. The concepts of a floating heatsink as disclosed herein (specifically with a TIM attached to the bottom of the heatsink) will be backward compatible with existing electronic components such as transceiver 325.

In FIG. 3A, lever arm 310 is included as a component of a floating heatsink. Lever arm 310, in this example, includes a roller actuator 350 and has a pivot point 345. Although not readily visible in FIG. 3A, retention bracket 305 includes protrusions (e.g., pins or pegs) to accept the opening associated with pivot point 345. FIG. 3A also introduces TIM 320 positioned to be connected (e.g., using an adhesive connection) to the bottom (i.e., large flat surface opposite fins) of heatsink 315. Finally cage 330 is illustrated and will act as a housing for an electronic component when assembling the components of FIG. 3A into a floating heatsink implementation.

Figure 3B:
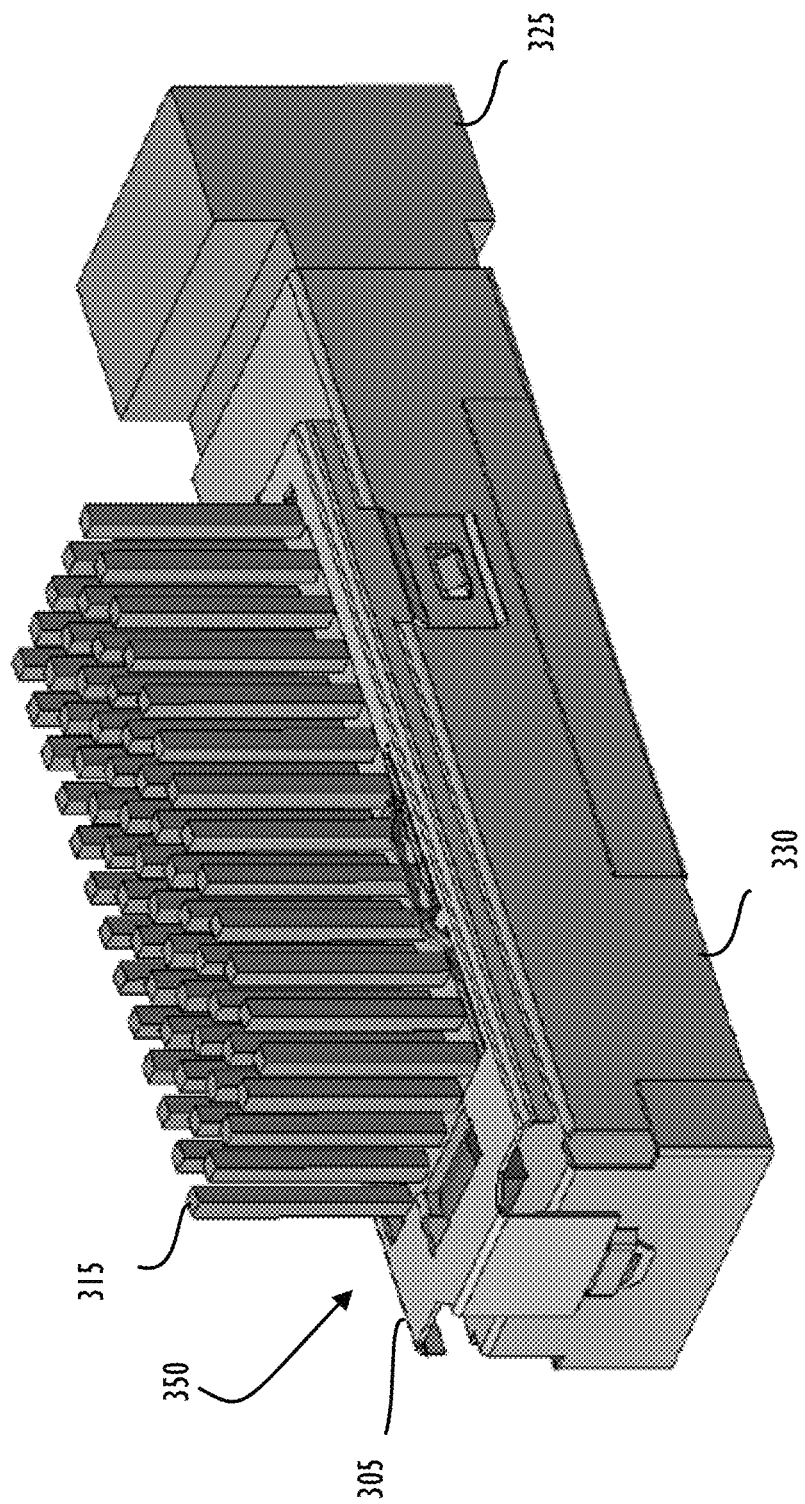
FIG. 3B illustrates the components of the exploded view of FIG. 3A as they may be assembled for use in a floating heatsink implementation in accordance with one or more examples of this disclosure.

FIG. 3B illustrates the components of the exploded view of FIG. 3A as they may be combined together (assembled) for use in a floating heatsink implementation in accordance with one or more examples of this disclosure. Cage 330, a portion of transceiver 325, retention bracket 305, and most of heatsink 315 remain visible in FIG. 3B. Roller actuator 350 may be seen via a small opening near the left side of retention bracket 305. In this example, because transceiver 325 is nearly fully inserted into cage 330, roller actuator 350 is beginning to impact the inserted end of transceiver 325. The impact and activation of roller actuator 350 may be better understood by referring to the discussion of FIGS. 4A-B provided below.

FIG. 4A is a block diagram illustrating an insertion mid phase (partial insertion) for a transceiver 425 into a floating heatsink implementation in accordance with this disclosure. FIG. 4B is a block diagram continuing the example of FIG. 4A at an insertion end phase (nearly full insertion) for the transceiver 425 into the floating heatsink implementation in accordance with this disclosure. In the examples herein, the heat dissipating surface 499 is an external surface of the electronic component (in this case the top of transceiver 425) that will become thermally connected to heatsink 410 as will be apparent to those of skill in the art.

As illustrated, the example of FIGS. 4A-B allows for use of TIM 420. In this example, TIM 420 is attached to the bottom flat surface (surface opposite of fins) of heatsink 410. Cage 430 defines a front opening 405A and has a back surface 405B such that transceiver 425 may be inserted into cage 430. Spring 415 acts against the top surface of the cage 430 to keep lever arm 422 in a position where heatsink 410 (and associated TIM 420) are raised (direction of arrow 451) to allow an insertion tolerance such that transceiver 425 does not impact TIM 420 throughout the insertion mid phase as illustrated in FIG. 4A (while transceiver 425 is inserted in direction of arrow 452 into cage 430). As mentioned above, the insertion tolerance represents the distance between the bottom of the heatsink 410 and top of transceiver throughout the insertion mid phase to allow TIM 420 to exist in an undisturbed manner (with minimal or no friction being applied to it).

When transceiver 425 is nearly fully inserted (insertion end phase of FIG. 4B), roller 423 engages the transceiver 425 and is forced upward in the direction of the arrow 451. As the roller 423 is forced upward, the roller 423 acts as an actuator to cause lever arm 422 to raise in the direction of arrow 451 and pivot around pivot 421. This pivot function causes heatsink (and associated TIM) to move in a downward direction (arrow 450) and come into contact with transceiver 425. When transceiver 425 is fully inserted spring 415 is more compressed than prior to insertion of transceiver 425. Thus, spring 415 acts to raise the end of lever arm 422 where heatsink 410 is attached and roller 423 provides an opposite directional force to that of spring 415.

FIG. 4C is a block diagram illustrating an insertion mid phase (partial insertion) for a transceiver 425 into an alternative floating heatsink implementation (e.g., cam 424 actuator rather than roller 423 as the actuator) in accordance with this disclosure. FIG. 4D is a block diagram continuing the example of FIG. 4C at an insertion end phase (nearly full insertion) for the transceiver 425 into the alternative floating heatsink implementation in accordance with this disclosure.

Many of the components in the alternative floating heatsink implementation are identical to and perform the same function as their counterparts shown in FIGS. 4A-B. Accordingly, the discussion of those components will not be repeated here. The difference being illustrated in this alternative floating heatsink implementation relates to the actuator being relative to the back surface 405B of cage 430 rather than the roller that extended through the top near the back in the previous example.

In this example, when transceiver 425 is at insertion end phase as shown in FIG. 4D, cam 424 is pushed in the direction of arrow 452 which causes an upward movement in the direction of arrow 451 to impart the downward movement (arrow 450) of heatsink 410.

The cam 424 and roller 423 actuators are only two examples and other implementations of actuators may be possible. For example, a wedge actuator (not shown) could function similarly to roller 423 such that the transceiver 425 slides along the angled part of the wedge to impart the pivot of the lever arm. Each of the obvious variants of actuators are intended to be considered within the scope of this disclosure.

Figure 5:
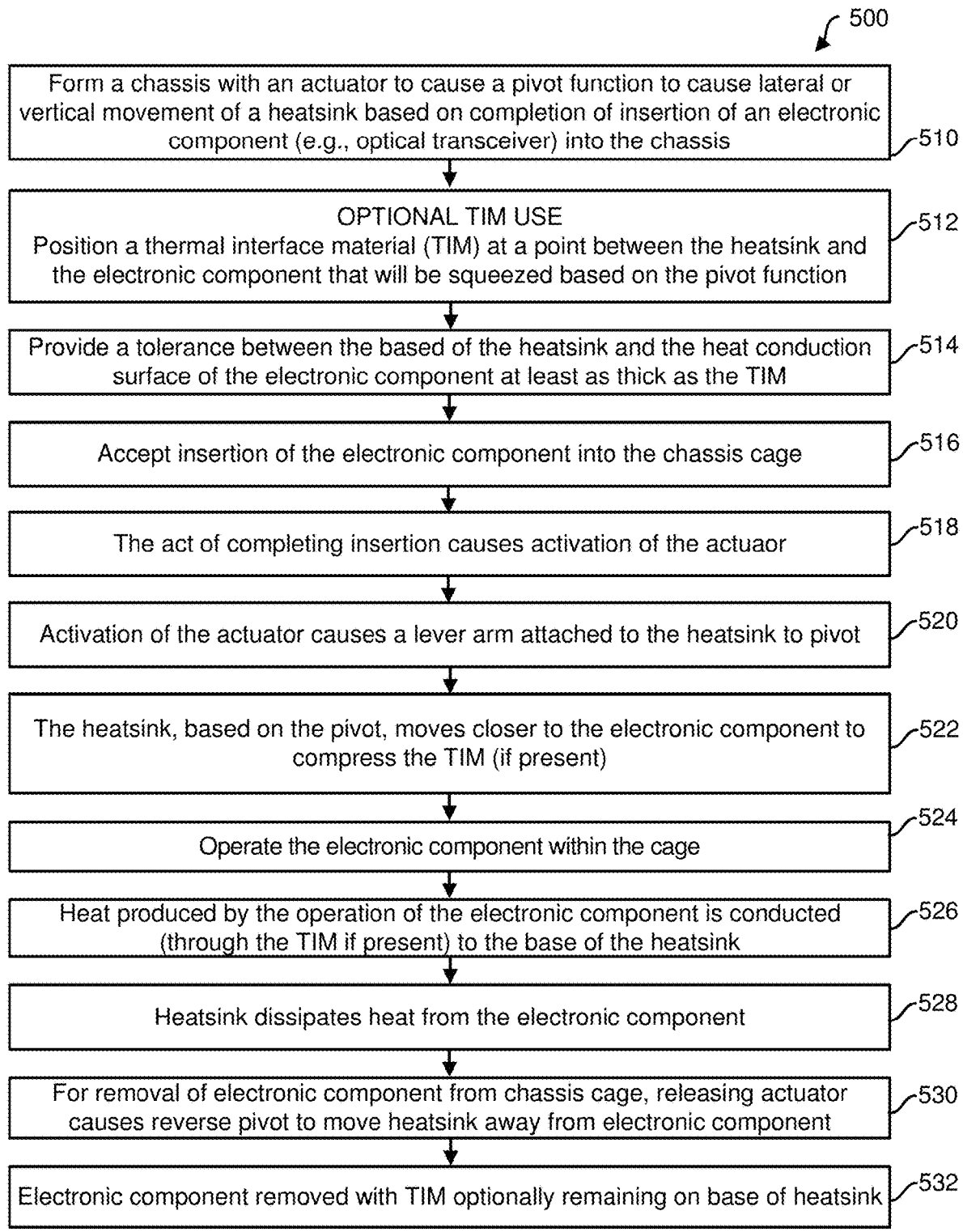
FIG. 5 illustrates a flowchart for a method of operation of the components utilized in a conceptual floating heatsink in accordance with the examples of this disclosure.

FIG. 5 illustrates a flowchart for a method 500 of operation of the components utilized in a conceptual floating heatsink in accordance with the examples of this disclosure. Example method 500 begins at block 510 where a chassis is provided that has an actuator to cause a pivot function to be performed. The actuator may be positioned at the rear of the chassis (such as cam 424 of FIGS. 4C-D) or at the top near the rear of the chassis (such as roller 423 of FIGS. 4A-B). Other types of actuators are possible without departing from the scope of this disclosure.

In any implementation of method 500, the pivot function performed upon actuator activation causes a lateral or vertical movement of a heatsink attached to a lever arm. The vertical movement may be down (as represented by arrows 450 in the two examples of FIGS. 4A-B and 4C-D) or may be from the bottom up if the lever arm were positioned below a bottom of the chassis cage. For example, a bottom up movement would exist if the chassis of FIGS. 4A-B were flipped 180 degrees along its horizontal axis.

In some cases, the lateral movement may be from either side. For example, if the chassis of FIGS. 4A-B were flipped 90 degrees along its vertical axis. In short, the actuator activation causes movement of the lever arm about a pivot point to impart motion of the heatsink such that the heatsink moves toward the inserted electronic component during, but not before, the insertion end phase.

Block 512 indicates that a TIM may be used to improve a thermally conductive connection (e.g., thermal coupling) between the heatsink and the electronic component being installed in the chassis. The TIM may be positioned on the underside of the heatsink or on an outer surface of the electronic module. The TIM may be positioned such that movement of the heatsink (via the pivot function) causes a squeezing (e.g., compression) of the TIM between the heatsink and the top surface of the electronic component. If no TIM is utilized, the movement of the heatsink (via the pivot function) may still create a thermal coupling between the heatsink and the electronic component. However, use of a TIM may produce a more efficient thermal coupling.

Block 514 indicates that the apparatus utilizing the floating heatsink technique may have a chassis formed to provide a tolerance between the base of the heatsink and the heat conduction surface of the electronic component. This tolerance refers to a spacing such that a TIM may exist as described herein and will not receive significant friction (possibly no friction) during insertion of the electronic component at least until the electronic component is nearly fully inserted.

Block 516 indicates that the cage is formed during its manufacture to accept insertion of the electronic component into the cage as described herein. Block 518 reiterates that the act of completing insertion causes activation of the actuator. Block 520 reiterates that the pivot function is responsive to activator activation and causes the lever arm to move. Block 522 indicates that the heatsink, based on the pivot, moves closer to the electronic component being installed and will compress a TIM if present therebetween. Block 524 indicates the electronic component that has been fully installed is able to perform operation and the heatsink will assist in maintaining proper operating temperatures (block 526).

Block 530 indicates that a reversal of the installation operation may be performed to remove the electronic component from the chassis cage. As the electronic component is pulled out of the open end (front in the above examples) of the chassis cage, the actuator may be released to cause a reverse pivot of the lever arm and move the heatsink that is attached to the lever arm away from the electronic component. Block 532 indicates that the electronic component may be removed without affecting a TIM that may be installed on a base of the heatsink. Upon deactivation of the actuator, the lever arm may move such that the original tolerance is again provided between the heatsink and the electronic module. A gel or paste TIM may be affected to some degree but a pad of material, if used, may be unaffected and remain attached to either the electronic component or the heatsink as designed.

The disclosed technique therefore allows for insertion of a first electronic component into a cage or other structure (e.g., chassis, docking bay, component bay) such that at the completion of insertion, a heatsink with or without a TIM may be lowered to create a thermal coupling between the heatsink and the first electronic component. In the examples used herein, the first electronic component was described as a transceiver, however, many other electronic components would benefit from the disclosed teaching of a floating heat sink.

Without this technique, a component may not be able to utilize a TIM, in part, because friction caused by a 'riding heatsink' while a component is being inserted into the cage would disturb the TIM. Lowering the heatsink at or near the end of the insertion motion, reduces or eliminates this friction and rubbing problem. The disclosed technique therefore helps maintain a proper and possibly better thermal coupling between electronic components and their associated heatsink to provide for an improved computing environment.

Although not illustrated or discussed in detail in this disclosure, the electronic component being inserted into the chassis cage may form a power coupling or communicative coupling as part of its insertion operation. For example, there may be blind mate connectors (not shown) that form a connection upon complete insertion. These blind mate connectors may provide different types of connectivity (power, data, etc.) to other components of the chassis. Specifically, when the chassis is a computing device chassis, these types of connection that form automatically upon insertion are common and provide operational functionality for the electronic component. In other implementations, cables may be connected independently of an insertion operation.

This concludes the detailed description. The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A cage assembly for receiving an electronic component for installation in a compute apparatus, comprising:
    a cage defining a first opening on a first end and an internal cavity between a top, a bottom, and two sides, the top defining a second opening and having a top interior surface facing the internal cavity; and
    a floating heatsink assembly retained on the cage proximate the second opening, the floating heatsink assembly including:
    a lever arm including a first end and a second end;
    an actuator structurally engaged to the first end of the lever arm, the actuator includes a roller or a cam;
    a heatsink structurally engaged to the second end of the lever arm, the heatsink retained over the second opening and above the top interior surface of the cage; and
    a pivot point defining a pivot axis about which the lever arm pivots;
    wherein as the electronic component is inserted into the internal cavity, the actuator is activated to pivot the lever arm via pressure on the first end, the lever arm lowering the heatsink toward the electronic component.

2. The cage assembly of claim 1, wherein a thermal interface material ("TIM") is attached to a bottom of the heatsink.

3. The cage assembly of claim 2, wherein the lowering of the heatsink toward the electronic component compresses the TIM between the bottom of the heatsink and a heat dissipating surface of the electronic component.

4. The cage assembly of claim 1, wherein the cage assembly is rotated 180 degrees and the top of the cage becomes the bottom of the cage.

5. The cage assembly of claim 1, wherein the cage assembly is rotated 90 degrees and the top of the cage becomes a side of the cage.

6. The cage assembly of claim 1, wherein the heatsink, retained over the second opening and above the top interior surface of the cage, is retained at a distance tolerance to allow insertion of the electronic component without touching a thermal interface material on a bottom of the heatsink.

7. The cage assembly of claim 1, wherein a thermal interface material is attached to a heat dissipating surface of the electronic component that aligns with the top interior surface of the cage assembly.

8. The cage assembly of claim 1, further comprising at least one blind mate connection for the electronic component.

9. A cage assembly comprising:
a cage having four exterior sides surrounding an internal cavity;
a lever arm positioned along one of the four exterior sides of the cage;
an actuator within the internal cavity to cause pivoting of the lever arm, the actuator includes a roller or a cam;
an electronic component fully inserted into the internal cavity and causing actuation of the actuator; and
a heatsink with a thermal interface material (TIM) providing thermal connectivity between the electronic component and the heatsink,
wherein a pressure is provided by the lever arm to force the heatsink to compress the TIM against the electronic component.

10. The cage assembly of claim 9, wherein upon initiation of removal of the electronic component, the actuator is released thereby reducing the pressure provided by the lever arm.

11. The cage assembly of claim 10, wherein the pressure provided by the lever arm is reduced to zero when removal of the electronic component passes a point associated with an insertion end phase.

12. A method of providing thermal conductivity between a floating heatsink and an electronic component, the method comprising:
inserting the electronic component into an opening of a cage assembly configured to receive the electronic component within an internal cavity of the cage assembly;
further inserting the electronic component through the opening and into the internal cavity toward a full installation depth;
engaging an actuator with the electronic component and within the internal cavity during an insertion end phase when the electronic component is close to full installation depth, the actuator to initiate a pivot motion, the actuator includes a roller or a cam;
causing pressure on the actuator by continuing the insertion, the pressure continuing the pivot motion via pressure to pivot a lever arm to structurally engage the floating heatsink, the pivot motion moving the floating heatsink toward the electronic component within the internal cavity; and
thermally coupling the floating heatsink and the electronic component through the lowering caused by the pivot motion.

13. The method of claim 12, further comprising compressing a thermal interface material ("TIM") between the floating heatsink and the electronic component as the floating heatsink is lowered.

14. The method of claim 13, wherein during an insertion mid phase preceding the insertion end phase, a gap tolerance is maintained between the TIM and the floating heatsink, the gap tolerance eliminated as the result of the lowering.

15. The method of claim 13, wherein the TIM is a paste, a gel, or a pad.

16. The method of claim 12, further comprising engaging at least one connection for the electronic component during the insertion end phase.

17. The method of claim 12, further comprising:
removing the electronic component from the cage, at least in part, by pulling the electronic component away from a back of the cavity,
wherein upon removal of the electronic component, the actuator initiates a reversal of the pivot motion and allows movement of the lever arm in a direction to cause raising of the floating heatsink away from the electronic component within the internal cavity.

* * * * *